(12) United States Patent
Saito et al.

(10) Patent No.: US 10,953,822 B2
(45) Date of Patent: Mar. 23, 2021

(54) ELECTRONIC CONTROL DEVICE AND ASSEMBLY METHOD THEREOF

(71) Applicant: Hitachi Automotive Systems, Ltd., Hitachinaka (JP)

(72) Inventors: Masato Saito, Hitachinaka (JP); Yoshio Kawai, Hitachinaka (JP); Ryo Akiba, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 0 days.

(21) Appl. No.: 16/316,849

(22) PCT Filed: Jun. 22, 2017

(86) PCT No.: PCT/JP2017/022993
§ 371 (c)(1),
(2) Date: Jan. 10, 2019

(87) PCT Pub. No.: WO2018/016261
PCT Pub. Date: Jan. 25, 2018

(65) Prior Publication Data
US 2019/0299881 A1 Oct. 3, 2019

(30) Foreign Application Priority Data
Jul. 19, 2016 (JP) .............................. JP2016-141537

(51) Int. Cl.
*H05K 5/00* (2006.01)
*H05K 5/06* (2006.01)
(Continued)

(52) U.S. Cl.
CPC .............. *B60R 16/02* (2013.01); *H02G 3/14* (2013.01); *H05K 5/0047* (2013.01); *H05K 5/062* (2013.01)

(58) Field of Classification Search
CPC ..................................................... H05K 7/00
See application file for complete search history.

(56) References Cited

U.S. PATENT DOCUMENTS 4,015,745 A 4/1977 Petrangelo
2009/0129035 A1* 5/2009 Kojima ................ H05K 5/0052
361/752

(Continued)

FOREIGN PATENT DOCUMENTS

CN 103905587 A 7/2014
CN 103929915 A 7/2014
(Continued)

OTHER PUBLICATIONS

Japanese-language Office Action issued in counterpart Japanese Application No. 2018-528459 dated Aug. 6, 2019 with English translation (six (6) pages).

(Continued)

*Primary Examiner* — Jerry Wu
(74) *Attorney, Agent, or Firm* — Crowell & Moring LLP

(57) ABSTRACT

Provided is an electronic control device that can reduce a usage amount of an adhesive constituting a seal member, by relieving a stress caused in the seal member disposed in a gap between a first housing part and a second housing part in a high-temperature environment. In an electronic control device including: a component mounting board mounted with an electronic component; and a first housing part and a second housing part that are fixed to each other via a seal member and define a first space that accommodates the component mounting board, at least one predetermined housing part of the first or second housing part has a recess formed on a surface facing the seal member, and a second space is formed between the recess and the seal member.

10 Claims, 10 Drawing Sheets

(51) Int. Cl.
*B60R 16/02* (2006.01)
*H02G 3/14* (2006.01)

(56) References Cited

U.S. PATENT DOCUMENTS

| | | |
|---|---|---|
| 2012/0320544 A1 | 12/2012 | Ohhashi et al. |
| 2013/0070432 A1* | 3/2013 | Kawai .................. H05K 5/0052 361/752 |
| 2013/0146323 A1 | 6/2013 | Yamaguchi et al. |
| 2016/0197462 A1 | 7/2016 | Hamada et al. |

FOREIGN PATENT DOCUMENTS

| | | |
|---|---|---|
| DE | 41 21 828 A1 | 1/1993 |
| EP | 1 806 960 A1 | 7/2007 |
| JP | 7-4525 A | 1/1995 |
| JP | 11-298158 A | 10/1999 |
| JP | 2003-63325 A | 3/2003 |
| JP | 3758038 B2 | 3/2006 |
| JP | 2014-3206 A | 1/2014 |
| JP | 2015-177003 A | 10/2015 |
| JP | 2016-109172 A | 6/2016 |

OTHER PUBLICATIONS

Chinese Office Action issued in Chinese Application No. 201780040162.X dated Feb. 6, 2020 (eight (8) pages).
International Search Report (PCT/ISA/210) issued in PCT Application No. PCT/JP2017/022993 dated Oct. 24, 2017 with English translation (three pages).
Japanese-language Written Opinion (PCT/ISA/237) issued in PCT Application No. PCT/JP2017/022993 dated Oct. 24, 2017 (four pages).
Extended European Search Report issued in European Application No. 17830781.5 dated Feb. 18, 2020 (eight (8) pages).

* cited by examiner

ENLARGED VIEW OF PORTION B

ENLARGED VIEW
OF PORTION B

C-C

ENLARGED VIEW OF PORTION B

C-C

ENLARGED VIEW OF PORTION B

ENLARGED VIEW OF PORTION B

ELECTRONIC CONTROL DEVICE AND ASSEMBLY METHOD THEREOF

TECHNICAL FIELD

The present invention relates to a structure of an electronic control device mounted on an automobile or the like.

BACKGROUND ART

In recent years, with an increase in output of engines in automobiles and improvement in performance of vehicles, mounting environment in an engine room and a driving condition of an electronic control device are becoming increasingly severe. Meanwhile, cost reduction of vehicles is also progressing. Therefore, even for electronic control devices mounted in engine rooms, a demand for high reliability and low cost is increasing.

An electronic control device mounted in an engine room is required to have a waterproof structure since there is a possibility of being wet with water. As the waterproof structure, a structure that seals a gap of a housing with a silicone waterproof adhesive or rubber packing is generally used. As a structure for sealing a gap of a housing with a waterproof adhesive, for example, there is a structure described in PTL 1.

PTL 1 describes "an onboard electronic apparatus including: a circuit board mounted with an integrated circuit and provided with a connector for input and output; a first housing fixed with the circuit board; a second housing fixed to the first housing and covering the circuit board such that a connecting part of the connector is exposed to outside the housing; and a waterproof seal that fixes and seals the first housing and the second housing, and seals a gap between these housings and the connector, in which the waterproof seal is obtained by mixing a water absorbing or hygroscopic organic filler and an inorganic filler in a resin that reacts with moisture in the atmosphere and is cured by cross-linking of polymers with each other" (refer to claim 1).

CITATION LIST

Patent Literature

PTL 1: JP 2014-3206 A

SUMMARY OF INVENTION

Technical Problem

In the waterproof structure described in PTL 1, a waterproof seal member is disposed in a gap between the first housing and the second housing fixed to each other by a screw or the like. Here, a thermal expansion coefficient of an adhesive constituting the seal member is very large with respect to thermal expansion coefficients of the first housing and the second housing. Therefore, a large stress is caused in the seal member under a high-temperature environment, and there is a possibility of breakage of the seal member. As a method of relieving the stress caused in the seal member, there is a method of increasing a volume of the seal member by increasing a usage amount of the adhesive constituting the seal member. However, since a silicone adhesive is a material with high cost, using this method is not preferable from the viewpoint of cost reduction of the electronic control device.

The present invention has been made in view of the above problems, and it is an object of the present invention to provide an electronic control device that can reduce a usage amount of an adhesive constituting a seal member, by relieving a stress caused in the seal member disposed in a gap between a first housing part and a second housing part in a high-temperature environment.

Solution to Problem

A first aspect of the present invention for solving the above problems is an electronic control device including: a component mounting board mounted with an electronic component; and first and second housing parts fixed to each other via a seal member and defining a first space that accommodates the component mounting board. In the electronic control device, at least one predetermined housing part of the first or second housing part has a recess formed on a surface facing the seal member, and a second space is defined between the recess and the seal member.

A second aspect of the invention for solving the above problems is an assembly method of an electronic control device including: a component mounting board mounted with an electronic component; and first and second housing parts fixed to each other via a seal member and defining a first space that accommodates the component mounting board, in which the first housing part has a recess formed on a surface facing the seal member and defining a second space between with the seal member, and a communication part that communicates the first space and the second space. The assembly method includes: a first step of filling an internal space of the recess with a hot melt adhesive heated and melted, and cooling and curing the hot melt adhesive; a second step of assembling the first housing part to the second housing part; a third step of heating and melting the hot melt adhesive that has been cooled and cured in the second step, in a state where the first housing part is disposed vertically above the second housing part; and a fourth step of cooling and curing the hot melt adhesive in a state where the hot melt adhesive filled in the recess flows out to outside the recess and fills a gap between the first housing part and the second housing part.

Advantageous Effects of Invention

According to the present invention, by releasing an increased amount in the volume of the seal member due to thermal expansion to a space (second space) defined between the seal member and the recess, it is possible to relieve a stress caused in the seal member under a high-temperature environment. This eliminates necessity of increasing the volume of the seal member in order to relieve the stress of the seal member, enabling reduction of a usage amount of the adhesive constituting the seal member.

DESCRIPTION OF EMBODIMENTS

Figure 1:
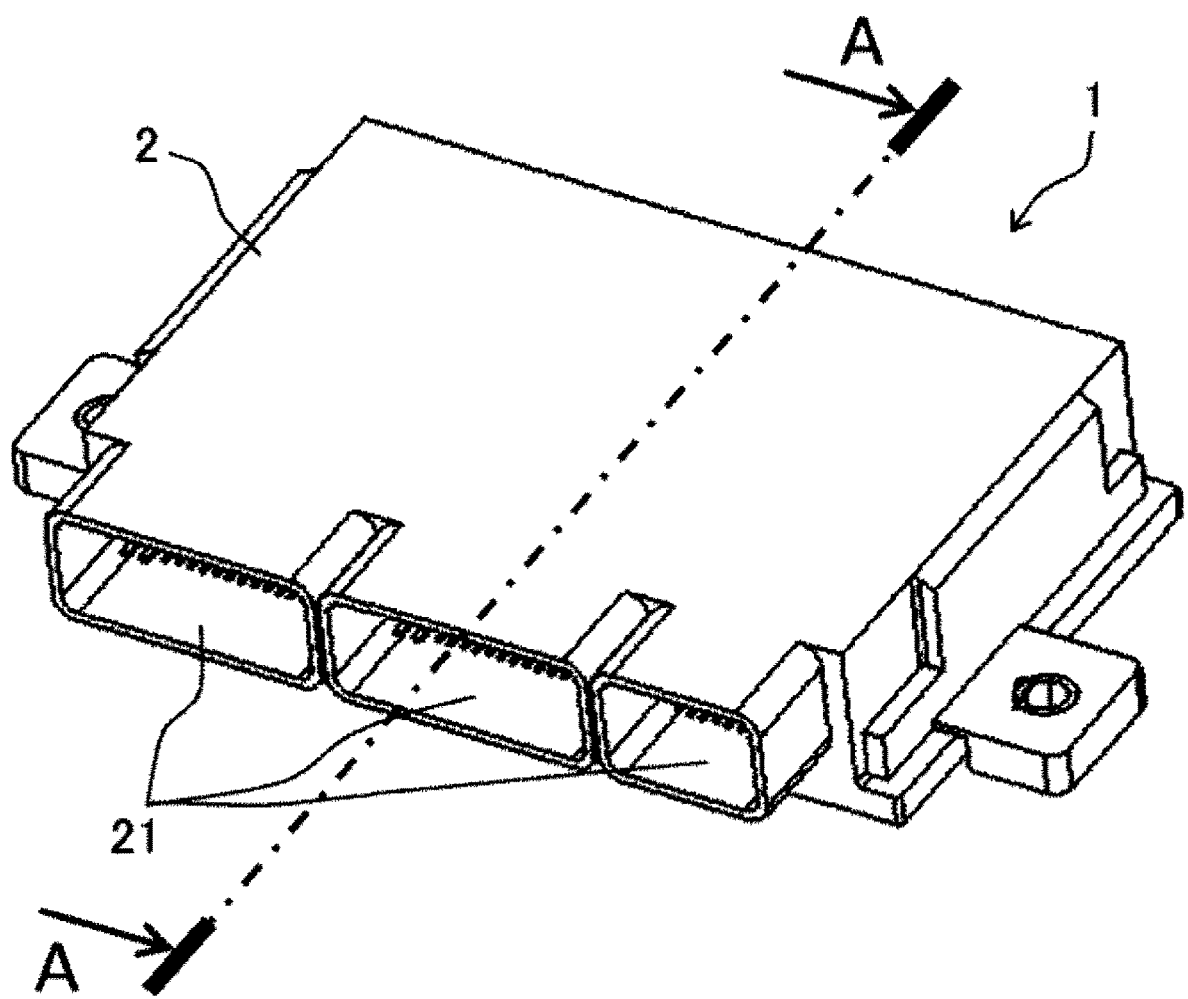
FIG. 1 is an external view of an electronic control device according to a first embodiment of the present invention.

Hereinafter, embodiments of the present invention will be described with reference to the drawings. It should be noted that, in the individual drawings, identical members are denoted by identical reference numerals, and redundant explanation will be omitted as appropriate.

First Embodiment

Figure 2:
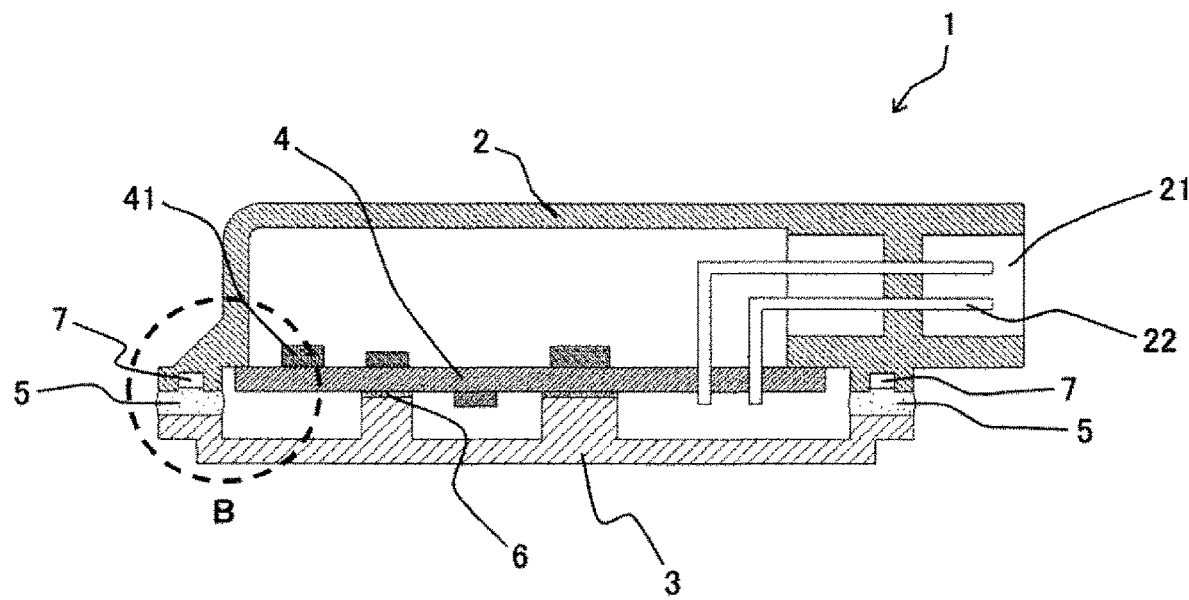
FIG. 2 is a cross-sectional view taken along line A-A in FIG. 1 and an enlarged view of a main part thereof.
Figure 2:
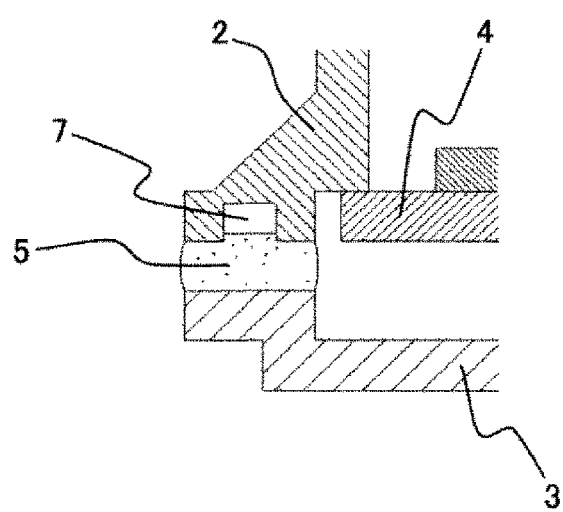

FIG. 1 is an external view of an electronic control device according to a first embodiment of the present invention, and FIG. 2 is a cross-sectional view taken along line A-A in FIG. 1 and an enlarged view of a main part thereof.

An electronic control device 1 according to this embodiment is, for example, an engine control unit (ECU) or an automatic transmission control unit (ATCU) mounted in an engine room.

The electronic control device 1 includes a component mounting board 4 on which a plurality of electronic components 41 are mounted, a first housing part 2, and a second housing part 3. The component mounting board 4 is accommodated inside a housing formed by the first housing part 2 and the second housing part 3.

The first housing part 2 is made of a resin such as polybutylene terephthalate (PBT), polyamide (PA), polyphenylene sulfide (PPS). With the first housing part 2, there is integrally formed a connector 21 to be connected to an external cable (not shown) such as a vehicle harness. Inside the connector 21, a plurality of connector terminals 22 made of a metal containing copper as a main component are arranged. The plurality of connector terminals 22 exchange a voltage and a current (signals) inside and outside the electronic control device 1.

The second housing part 3 is molded with a resin such as polybutylene terephthalate (PBT), polyphenylene sulfide (PPS), nylon (PA), or a metal containing aluminum or iron as a main component. The second housing part 3 is fixed to the first housing part 2 with use of a means such as a screw, caulking, or snap fit. In a gap between the first housing part 2 and the second housing part 3, a seal member 5 made of a waterproof adhesive is disposed. This can prevent entering of water into a housing space (first space) of the component mounting board 4 defined by the first housing part 2 and the second housing part 3.

The component mounting board 4 is a multilayer board having a base material made of glass cloth impregnated with epoxy resin as a main material and having a plurality of copper wiring layers. The plurality of electronic components 41 are mounted on both surfaces of the component mounting board 4 by soldering, and constitute an electric circuit together with board wiring. Among the plurality of electronic components 41, an electronic component with heat generation (hereinafter referred to as "heat generating electronic component") is thermally connected to the second housing part 3 via a heat dissipation member 6 as required. This enables heat caused by the heat-generating electronic component to be dissipated to outside air via the second housing part 3.

On a surface of the first housing part 2 facing the seal member 5, a recess 7 is formed so as to surround an outer periphery of the component mounting board 4. Between the recess 7 and the seal member 5, an annular space (second space) separated from the housing space (first space) of the component mounting board 4 is defined. That is, the internal space (second space) of the recess 7 is partitioned from the first space by an inner peripheral wall of the recess 7 and the seal member 5. It should be noted that, in the example shown in FIG. 2, the second space (internal space of the recess 7) is a sealed space, and the first space and the second space are completely separated, but it is not necessary to completely separate the first space from the second space, as shown in the later embodiment.

Since the seal member 5 is sandwiched between the first housing part 2 and the second housing part 3 fixed to each other, a large stress is caused in the seal member 5 due to a difference in a thermal expansion coefficient of each member when exposed to a high-temperature environment.

For example, a coefficient of thermal expansion of a silicone adhesive generally used in the seal member 5 is 100 to 300 ppm/° C., a thermal expansion coefficient of reinforced PBT resin containing glass fiber generally used in the first housing part 2 is 20 to 50 ppm/° C., and a thermal expansion coefficient of aluminum generally used in the second housing part 3 is 20 to 25 ppm/° C. As described above, since the seal member 5 having a large thermal expansion coefficient is sandwiched between the first housing part 2 and the second housing part 3 having small thermal expansion coefficients, a large stress is caused in the seal member 5 under a high-temperature environment.

According to the electronic control device 1 according to this embodiment, by releasing an increased amount in a volume of the seal member 5 due to thermal expansion to the internal space (second space) of the recess 7, it is possible to relieve a stress caused in the seal member 5 under a high-temperature environment. This eliminates necessity of increasing the volume of the seal member 5 in order to relieve the stress of the seal member 5, enabling reduction of a usage amount of the adhesive constituting the seal member 5.

It should be noted that a bonding area between the first housing part 2 and the seal member 5 is reduced since the recess 7 is formed in the first housing part 2, but forming the first housing part 2 with a resin resistant to corrosion such as salt damage as compared with metal can secure the reliability of the seal member 5.

Second Embodiment

An electronic control device according to a second embodiment of the present invention will be described focusing on differences from the first embodiment.

In the electronic control device 1 according to the first embodiment (shown in FIG. 2), the internal space (second space) of the recess 7 is a sealed space. Therefore, pressure of air trapped in the internal space (second space) of the recess 7 under a high-temperature environment becomes high, and a force acts to the seal member 5 in a direction for preventing entry into the internal space of the recess 7. This embodiment is to solve this problem.

Figure 3:
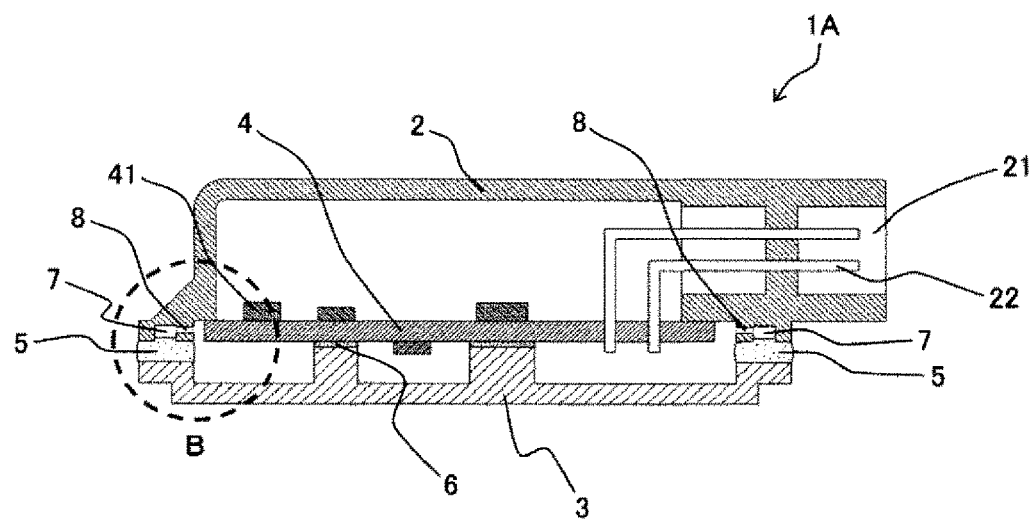
FIG. 3 is a cross-sectional view of an electronic control device according to a second embodiment of the present invention and an enlarged view of a main part thereof.
Figure 3:
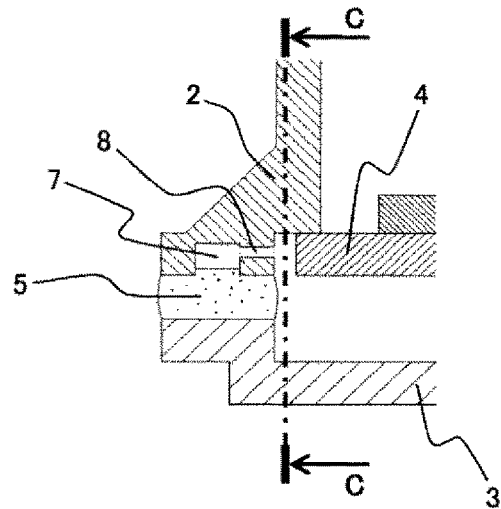
Figure 3:
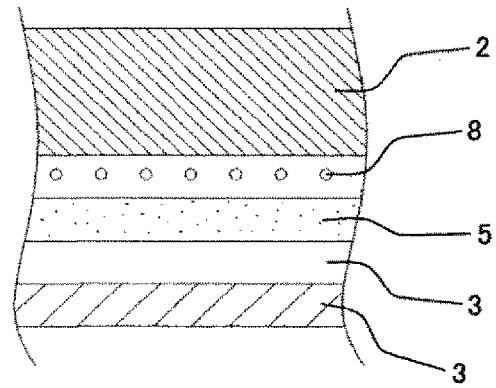

FIG. 3 shows a cross-sectional view of the electronic control device 1 according to this embodiment and an enlarged view of a main part thereof.

In FIG. 3, on a first housing part 2 (a wall on an inner peripheral side of a recess 7), there is provided a through hole 8 that communicates an internal space (second space) of the recess 7 and a housing space (first space) of a component mounting board 4. Meanwhile, a number and a shape of the through holes 8 can be appropriately changed. In addition, in the first housing part 2, an air intake filter (not shown) having waterproofness and air permeability is provided.

According to an electronic control device 1A of this embodiment, in addition to the same effect as the first embodiment, the following effects can be obtained.

By maintaining an internal pressure of the housing space (first space) of the component mounting board 4 at the same level as an atmospheric pressure via the air intake filter, and communicating the internal space (second space) of the recess 7 with the housing space (first space) of the component mounting board 4 via the through hole 8, an internal pressure of the internal space (second space) of the recess 7 is maintained at the same level as the atmospheric pressure even under a high-temperature environment. This allows an increased amount in a volume of a seal member 5 due to thermal expansion to be more smoothly released to the internal space (second space) of the recess 7, enabling further relief of a stress caused in the seal member 5.

FIG. 4 shows an example of an assembling procedure of the electronic control device 1A according to this embodiment. Meanwhile, FIG. 4 shows an example in a case where a hot melt adhesive is used as an adhesive constituting the seal member 5. The hot melt adhesive is an adhesive that is remelted by applying heat after cured once.

First, the hot melt adhesive heated and melted is filled in the recess 7 of the first housing part 2 in advance, and cooled and cured. At this time, it is necessary to fill a sufficient amount of the hot melt adhesive in the recess 7 to block the gap between the first housing part 2 and a second housing part 3.

Figure 4A:
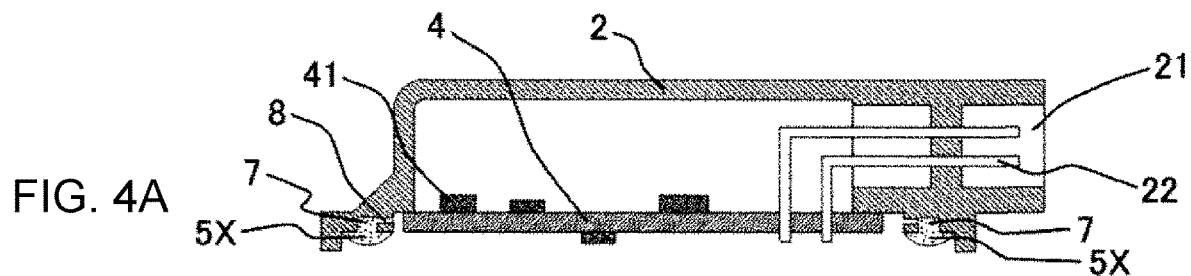
FIGS. 4A-4C are views showing an assembling procedure of the electronic control device according to the second embodiment of the present invention.

Subsequently, as shown in FIG. 4(a), the component mounting board 4 mounted with an electronic component 41 is assembled to the first housing part 2.

Figure 4B:
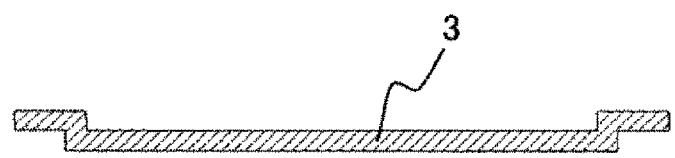
Figure 4B:
Figure 4B:
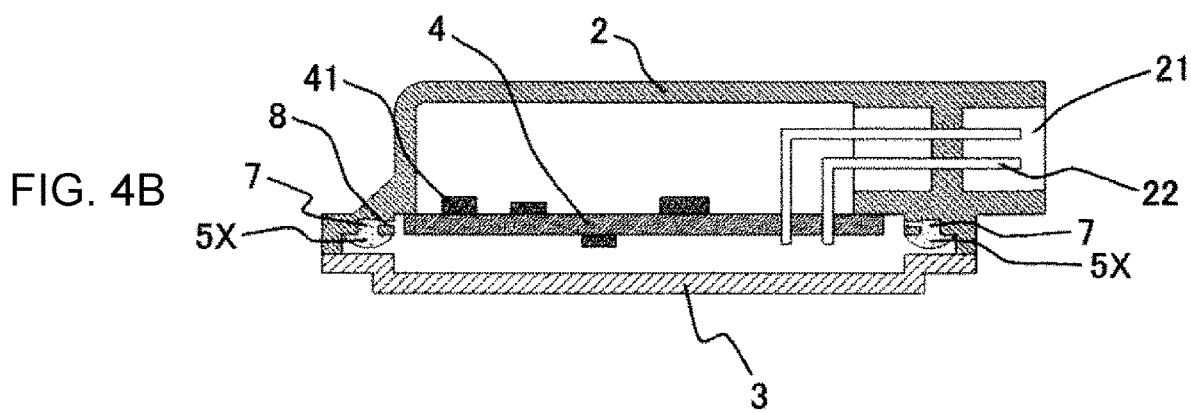

Subsequently, as shown in FIG. 4(b), the second housing part 3 is assembled to the first housing part 2. At this time, a gap is formed between a cured hot melt adhesive 5X and the second housing part 3.

Figure 4C:
Figure 4C:
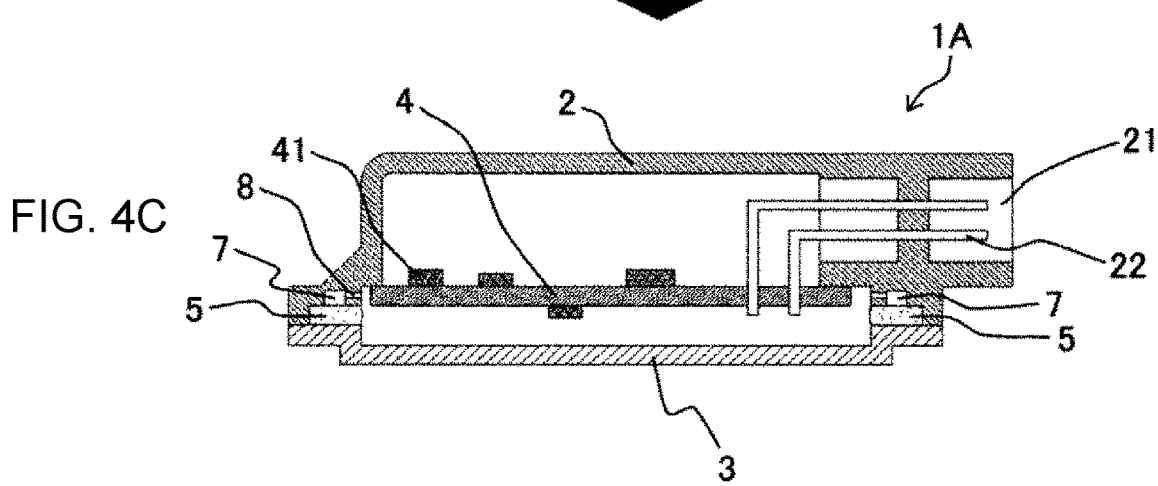

Subsequently, in a state where the first housing part 2 is disposed vertically above the second housing part 3, the first housing part 2 and the second housing part 3 are heated in a curing oven. As a result, the hot melt adhesive 5X is remelted and flows out to outside the recess 7, a space (second space) is defined inside the recess 7, and a gap between the first housing part 2 and the second housing part 3 is blocked. At this time, since the through hole 8 acts as an air intake port, the hot melt adhesive smoothly flows out to outside the recess 7, enabling good filling property to be obtained. The seal member 5 is formed as shown in FIG. 4(c) by cooling and curing the hot melt adhesive that blocks the gap between the first housing part 2 and the second housing part 3.

According to the assembling procedure described above, since the hot melt adhesive heated and melted is filled in the recess 7 in advance and is cooled and cured, it is unnecessary to apply an adhesive in the assembling process of the electronic control device 1A. This can simplify the assembly process, allowing the electronic control device 1A to be manufactured at low cost.

Third Embodiment

An electronic control device according to a third embodiment of the present invention will be described focusing on differences from the second embodiment.

Figure 5:
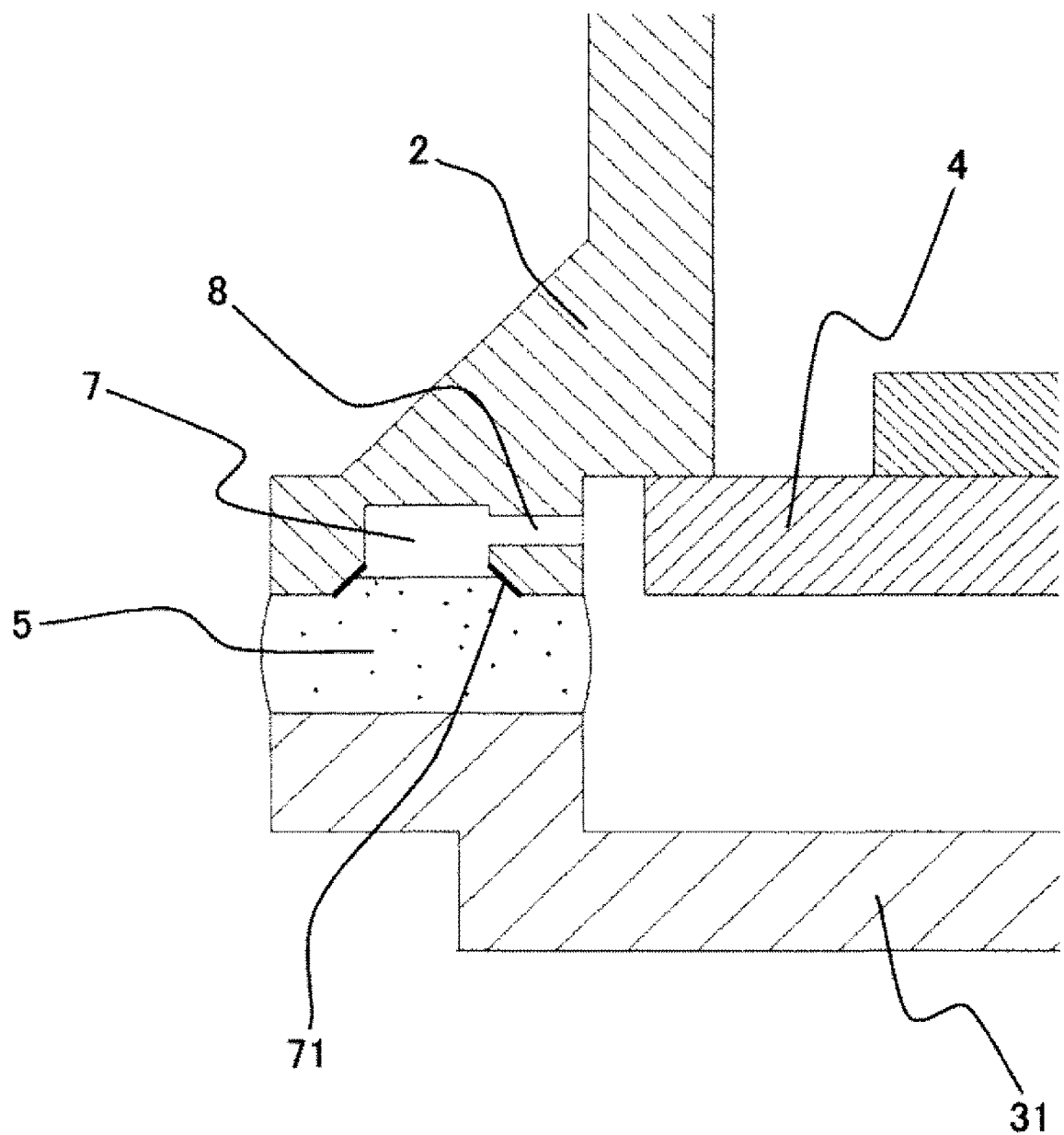
FIG. 5 is a cross-sectional view of an electronic control device according to a third embodiment of the present invention and an enlarged view of a main part thereof.

FIG. 5 shows an enlarged cross-sectional view of a main part of the electronic control device according to this embodiment.

In FIG. 5, a difference from the electronic control device 1A according to the second embodiment (shown in FIG. 3) is that an edge 71 of a recess 7 is formed in a tapered shape.

According to an electronic control device 1 of this embodiment, in addition to the same effect as the second embodiment, the following effects can be obtained.

Figure 6:
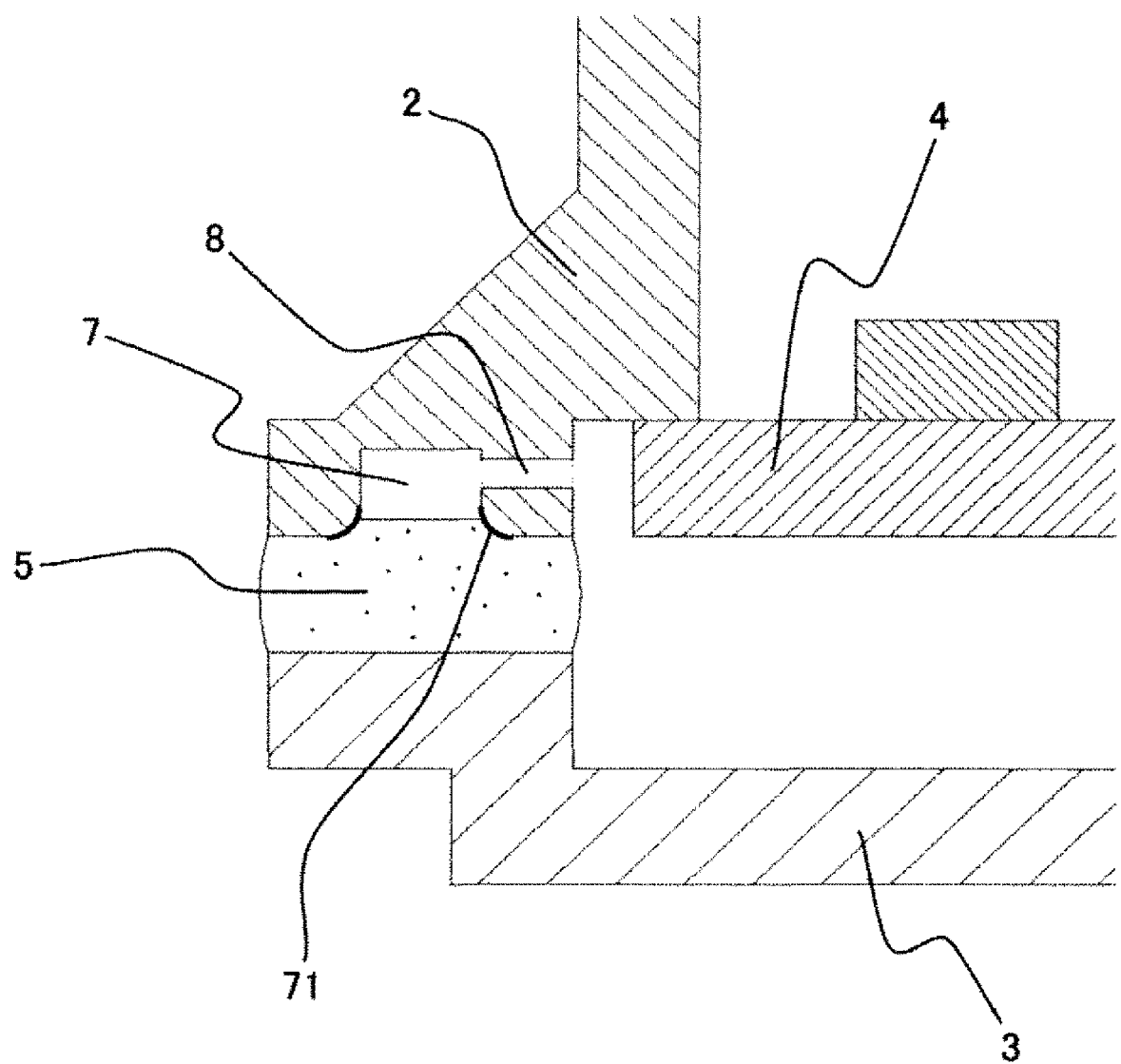
FIG. 6 is an enlarged cross-sectional view of a main part of an electronic control device according to a modification of the third embodiment of the present invention.
Figure 7:
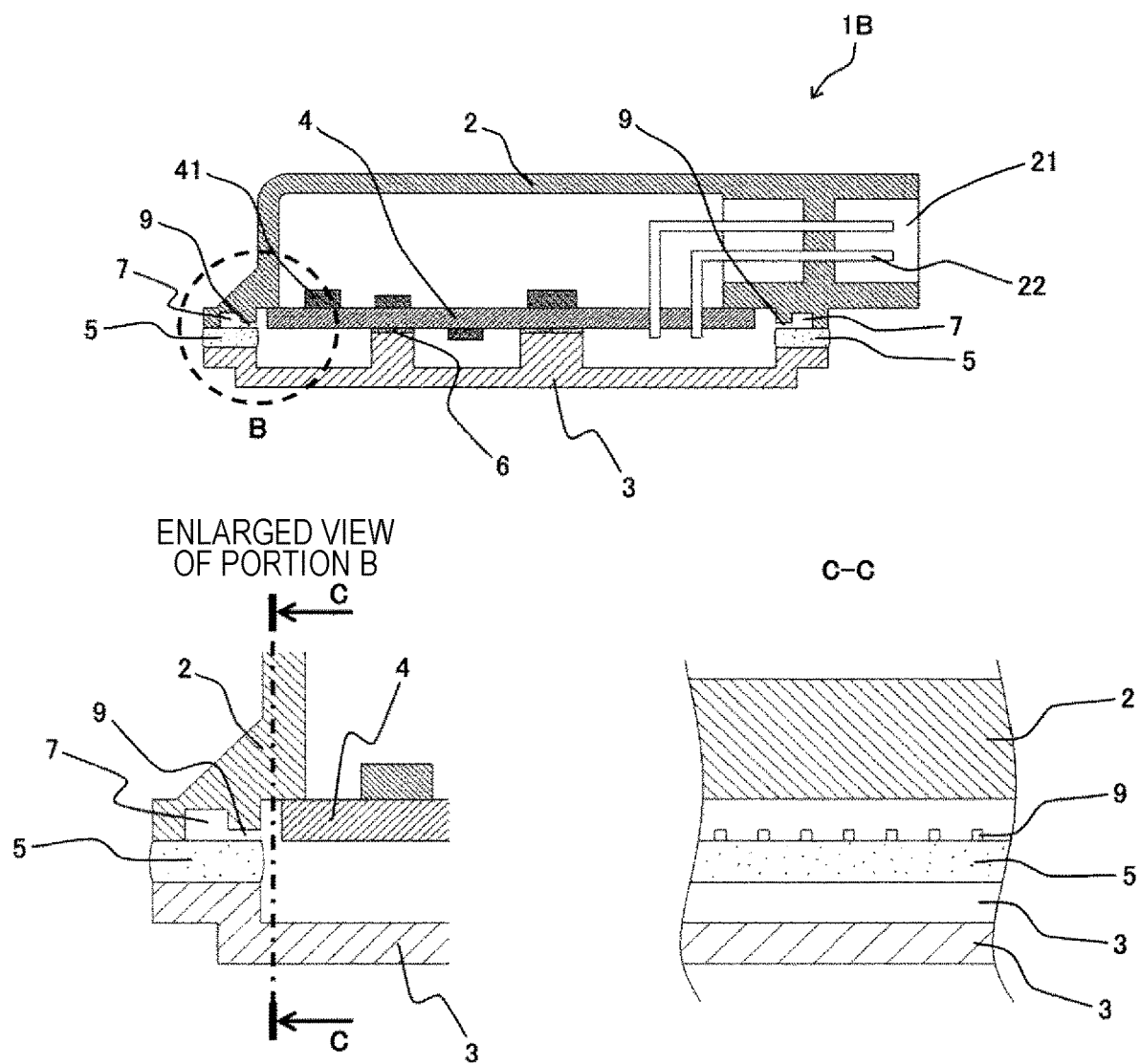
FIG. 7 is a cross-sectional view of an electronic control device according to a fourth embodiment of the present invention and an enlarged view of a main part thereof.

By forming the edge 71 of the recess 7 in a tapered shape, an adhesion interface between a seal member 5 and the vicinity of the edge 71 becomes gentle when an increased amount in a volume of the seal member 5 due to thermal expansion enters inside the recess 7, enabling relief of stress concentration caused in the vicinity of the edge 71 of the seal member 5. It should be noted that the shape of the edge 71 is not limited to the tapered shape and may be formed with a cross section of an R shape as shown in FIG. 6, for example.

Fourth Embodiment

An electronic control device according to a fourth embodiment of the present invention will be described focusing on differences from the second embodiment.

In the electronic control device 1A according to the second embodiment (shown in FIG. 3), the internal space (second space) of the recess 7 and the housing space (first space) of the component mounting board 4 are communicated with each other via the through hole 8. In a case of manufacturing such a first housing part 2 with a metal mold, after the metal mold is operated in a vertical direction and the whole is injection-molded, it is necessary to bore the through hole 8 by using a pin that slides in a direction perpendicular to an operation direction (vertical direction) of the metal mold. Therefore, a structure of the metal mold to mold the first housing part 2 becomes complicated, and the manufacturing cost of the first housing part 2 may increase. This embodiment is to solve this problem.

Figure 8:
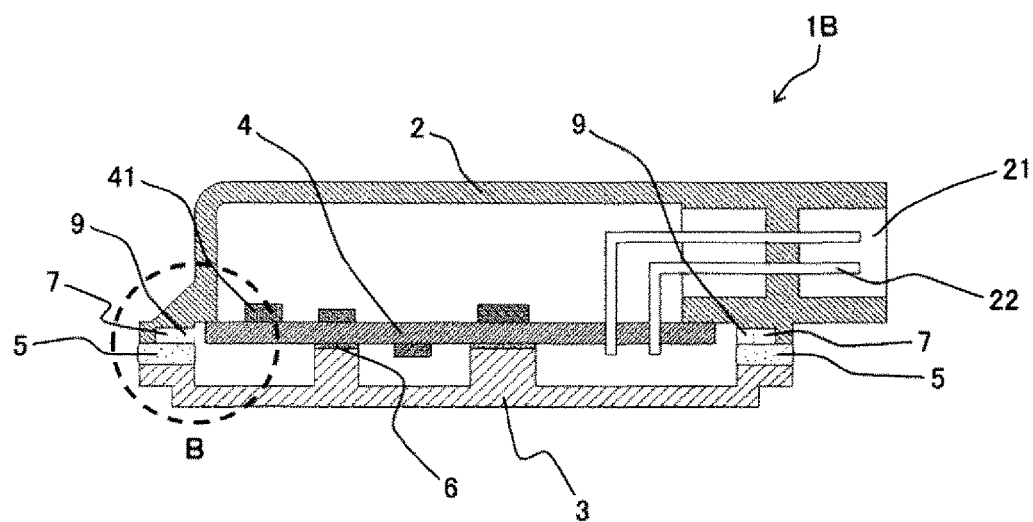
FIG. 8 is a cross-sectional view of an electronic control device according to a modification of the fourth embodiment of the present invention and an enlarged view of a main part thereof.
Figure 8:
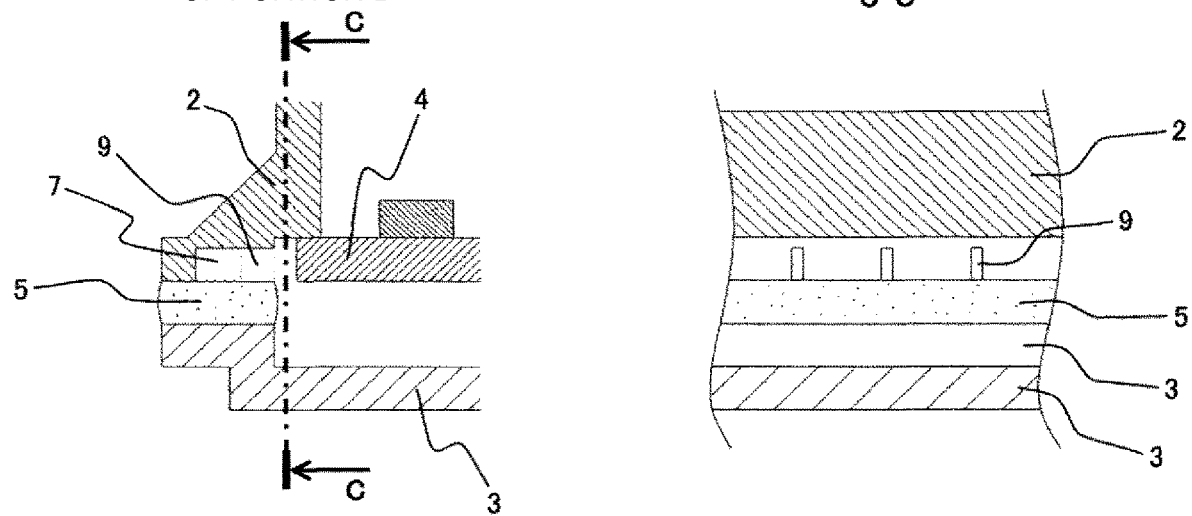

FIG. 8 shows a longitudinal cross-sectional view of the electronic control device according to this embodiment.

In FIG. 8, a through hole 8 (shown in FIG. 3) is not formed in a first housing part 2 (a wall on an inner peripheral side of a recess 7), but there is formed a groove 9 that communicates an internal space (second space) of the recess 7 with a housing space (first space) of a component mounting board 4, on a surface of the first housing part 2 facing a seal member 5 (an end surface of the wall on the inner peripheral side of the recess 7).

According to an electronic control device 1 of this embodiment, in addition to the same effect as the second embodiment, the following effects can be obtained.

The groove 9 that communicates the internal space (second space) of the recess 7 with the housing space (first space) of the component mounting board 4 can be formed by operating a metal mold in a vertical direction. This can simplify a structure of the metal mold of the first housing part 2, enabling manufacture of the first housing part 2 at low cost.

It should be noted that a number and a shape of the grooves 9 can be appropriately changed. For example, as shown in FIG. 8, the number of the grooves 9 may be reduced, and a depth of the groove 9 may be made to coincide with a depth of the recess 7. By reducing the number of the grooves 9 in this manner, it is possible to enlarge a bonding area between the seal member 5 and the first housing part 2, enabling improvement of waterproofness of the electronic control device 1B. Further, by making the depth of the groove 9 coincide with the depth of the recess 7, it is possible to secure a communication passage between the internal space (second space) of the recess 7 and the housing space (first space) of the component mounting board even when an increased amount in a volume of the seal member 5 due to thermal expansion deeply enters the inside of the recess 7.

Fifth Embodiment

An electronic control device according to a fourth embodiment of the present invention will be described focusing on differences from the second embodiment.

In the electronic control device 1A according to the second embodiment (shown in FIG. 3), the recess 7 and the through hole 8 are provided in the first housing part 2. Therefore, a structure of the first housing part 2 becomes complicated, and the manufacturing cost of the first housing part 2 may increase. This embodiment is to solve this problem.

Figure 9:
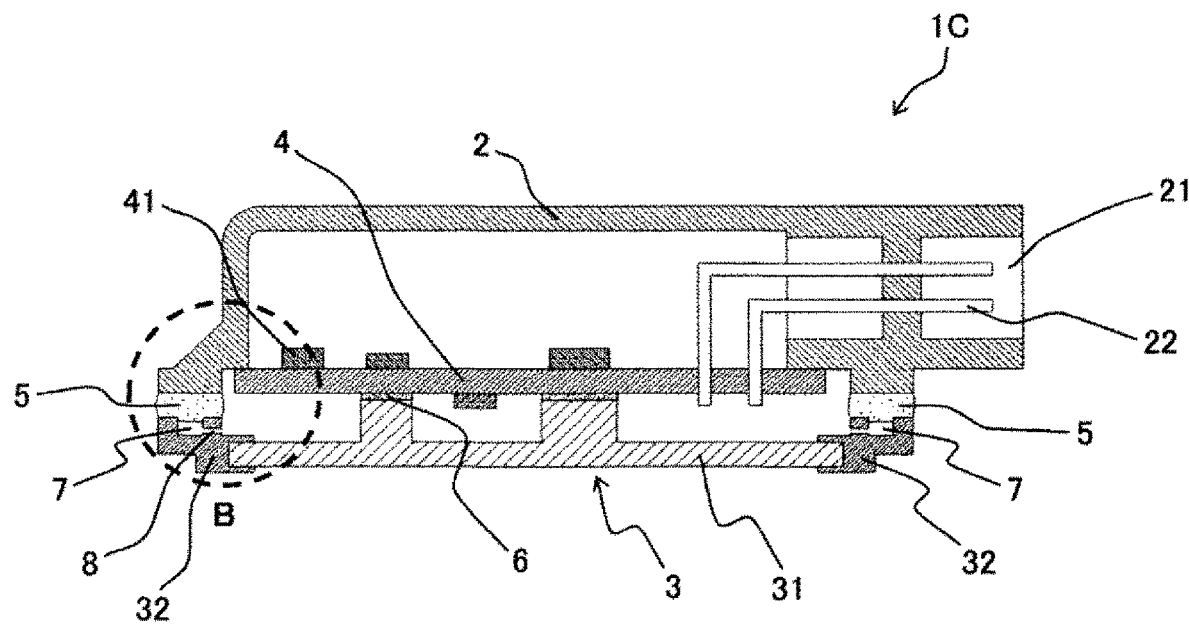
FIG. 9 is a cross-sectional view of an electronic control device according to a fifth embodiment of the present invention and an enlarged view of a main part thereof.
Figure 9:
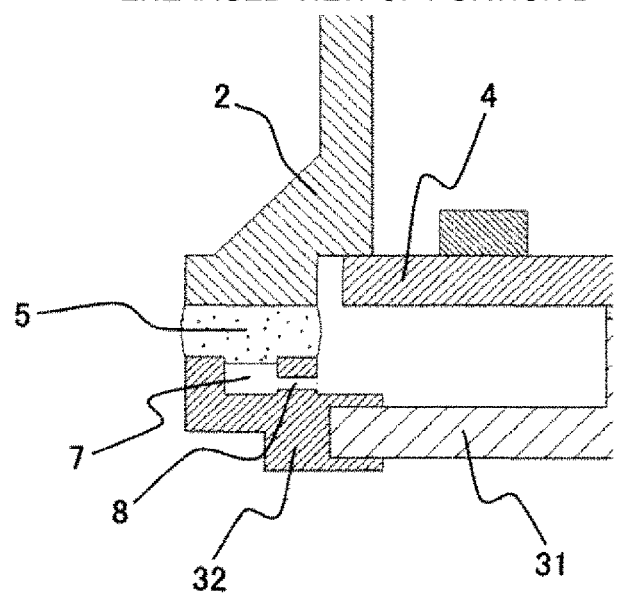

FIG. 9 shows a cross-sectional view of an electronic control device according to this embodiment.

In FIG. 9, a second housing part 3 is formed by a metal heat dissipation plate 31 and by a mold resin 32 molded on an outer peripheral part of the metal heat dissipation plate 31 and bonded to a first housing part 2. The mold resin 32 has a recess 7 formed on a surface facing a seal member 5 and a through hole 8 communicating an internal space (first space) of the recess 7 with a housing space (second space) of a component mounting board 4. Whereas, the recess 7 and the through hole 8 are not formed in the first housing part 2.

According to an electronic control device 1C of this embodiment, in addition to the same effect as the second embodiment, the following effects can be obtained.

By providing the recess 7 and the through hole 8 in the second housing part 3, it is not necessary to provide the recess 7 and the through hole 8 in the first housing part 2. This can simplify the structure of the first housing part 2, enabling manufacture of the first housing part 2 at low cost.

Meanwhile, the reliability of the seal member 5 can be secured by forming a portion of the second housing part 3 to be bonded to the first housing part 2 with the mold resin 32 resistant to corrosion such as salt damage.

Sixth Embodiment

An electronic control device according to a sixth embodiment of the present invention will be described focusing on differences from the second and fifth embodiments.

In the electronic control device 1A according to the second embodiment (shown in FIG. 3), the recess 7 is formed only in the first housing part 2. Whereas, in the electronic control device 1C according to the fifth embodiment (shown in FIG. 9), the recess 7 is formed only in the second housing part 3. Therefore, in any of the embodiments, deformation due to thermal expansion may concentrate on one surface of the seal member 5. This embodiment is to solve this problem.

Figure 10:
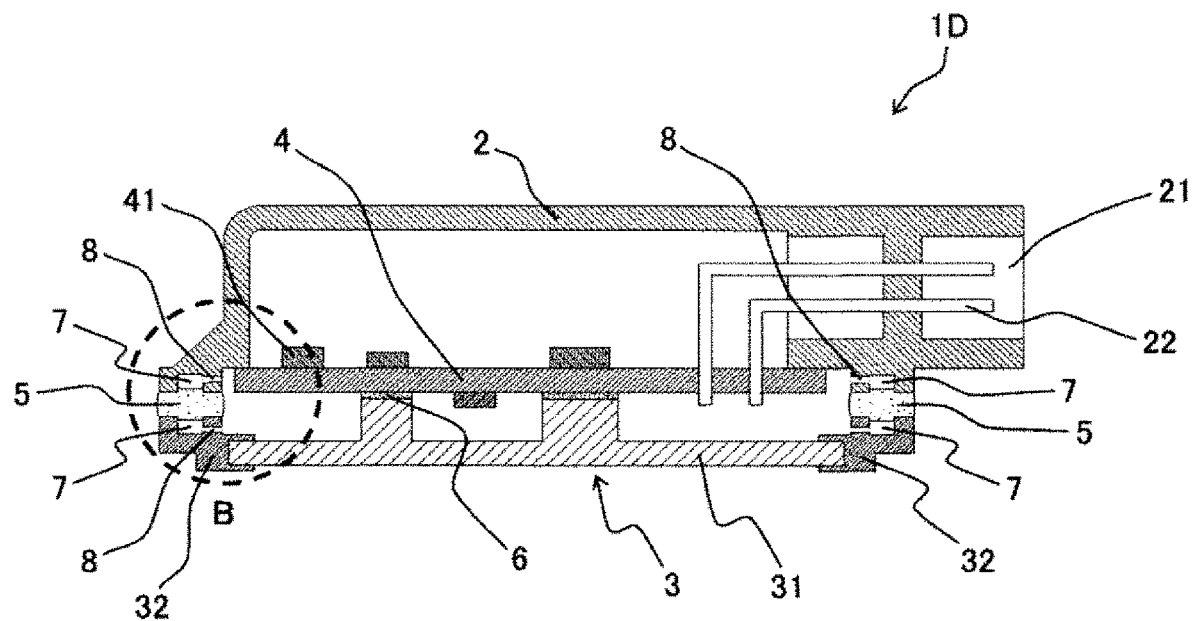
FIG. 10 is a cross-sectional view of an electronic control device according to a sixth embodiment of the present invention and an enlarged view of a main part thereof.
Figure 10:
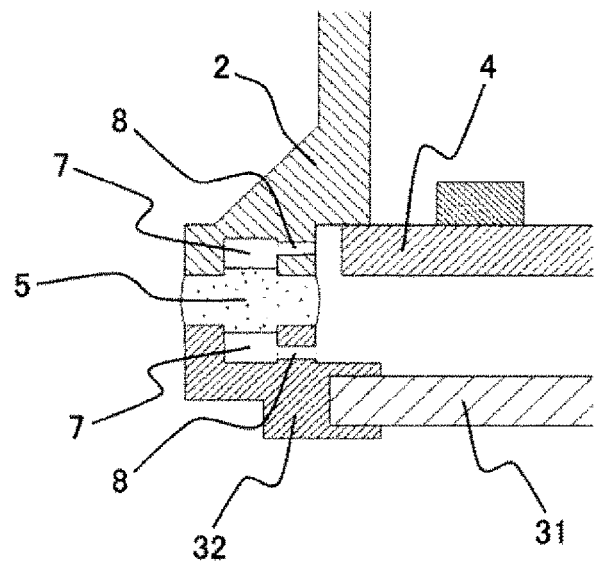

FIG. 10 shows a cross-sectional view of an electronic control device according to this embodiment.

In FIG. 10, a first housing part 2 is configured similarly to the electronic control device 1A according to the second embodiment (shown in FIG. 3), and a second housing part 3 is configured similarly to the electronic control device 1C according to the fifth embodiment (Shown in FIG. 9).

According to an electronic control device 1D of this embodiment, in addition to the same effect as the fifth embodiment, the following effects can be obtained.

By providing a recess 7 in both the first housing part 2 and the second housing part 3, a volume of a space (second space) defined between a seal member 5 and the recess 7 is increased, making it possible to release even more of an increased amount in the volume of the seal member 5 due to thermal expansion. This enables further relief of a stress caused in the seal member 5.

Although the embodiments of the present invention have been described in detail above, the present invention is not limited to the above-described embodiments, but includes various modifications. For example, the embodiments described above have been illustrated in detail to facilitate description for easy understanding of the present invention, and are not necessarily limited to the embodiments that include all the illustrated configurations. Additionally, a configuration of one embodiment may be added with a part of a configuration of another embodiment, and a part of a configuration of an embodiment may be deleted, or may be replaced with a part of another embodiment.

REFERENCE SIGNS LIST 1, 1A, 1B, 1C, 1D electronic control device
2 first housing part
21 connector
22 connector terminal
3 second housing part
31 heat dissipation plate
32 mold resin
4 component mounting board
41 electronic component
5 seal member
6 heat dissipation member
7 recess
71 edge
8 through hole (communication part)
9 groove (communication part)

The invention claimed is:

1. An electronic control device comprising: a component mounting board mounted with an electronic component; and a first housing part and a second housing part that are fixed to each other via a seal member and define a first space that accommodates the component mounting board, wherein the first housing part include a predetermined housing part, the predetermined housing part having an inner periphery wall surrounding an outer periphery of the component mounting board along with an outer periphery wall and a recess formed between the inner and outer periphery walls on a bonding surface to the seal member, a second space is defined between the recess and the seal member, the recess is sealed by bonding the seal member to the inner and outer periphery walls; the inner periphery wall has a through hole that communicates the first space and the second space; wherein the through hole is configured to maintain the internal pressure between the second space and the first space.

2. The electronic control device according to claim 1, wherein the communication part is formed by at least one groove formed on a surface of the predetermined housing part, the bonding surface to the seal member.

3. The electronic control device according to claim 1, wherein the predetermined housing part is made of resin.

4. The electronic control device according to claim 1, wherein an edge of the recess is formed in a tapered shape.

5. The electronic control device according to claim 1, wherein an edge of the recess is formed with a cross section of an R shape.

6. The electronic control device according to claim 1, wherein a connector for external exchange of a signal is formed integrally with the first housing part, and
the recess is formed in the first housing part.

7. The electronic control device according to claim 1, wherein the second housing part is formed by a metal heat dissipation plate and by a mold resin molded on an outer peripheral part of the heat dissipation plate and bonded to the first housing part, and
the recess is formed in the mold resin.

8. The electronic control device according to claim 1, wherein the seal member is made of a hot melt adhesive.

9. The electronic control device according to claim 1, wherein the recess is formed in both of the first housing part and the second housing part.

10. An assembly method of an electronic control device, the method comprising: providing a component mounting board mounted with an electronic component; providing a first housing part and a second housing part that are fixed to each other via a seal member and define a first space that accommodates the component mounting board, wherein the first housing part has an inner periphery wall surrounding an outer periphery of the component mounting board along with an outer periphery wall and a recess formed between the inner and outer periphery walls on a bonding surface to the seal member and defining a second space between with the seal member, and a communication part that communicates the first space and the second space; filling an internal space of the recess with a hot melt adhesive heated and melted, and cooling and curing the hot melt adhesive; assembling the first housing part to the second housing part; heating and melting the hot melt adhesive that has been cooled and cured, in a state where the first housing part is disposed vertically above the second housing part; and cooling and curing the hot melt adhesive in a state where the hot melt adhesive filled in the recess flows out to outside the recess and fills a gap between the first housing part and the second housing part, wherein
the recess is sealed by bonding the seal member to the inner and outer periphery walls; the inner periphery wall has a through hole that communicates the first space and the second space; wherein the through hole is configured to maintain the internal pressure between the second space and the first space.

\* \* \* \* \*